United States Patent
Chari et al.

[11] Patent Number: 5,436,607
[45] Date of Patent: Jul. 25, 1995

[54] OPEN (NON-ENCLOSED) MAGNETS FOR MAGNETIC RESONANCE IMAGING

[75] Inventors: Madabushi V. Chari, Burnt Hills; Evangelos T. Laskaris, Schenectady; Gary Bedrosian, Slingerlands; Michele D. Ogle, Burnt Hills, all of N.Y.

[73] Assignee: General Electric Company, Schenectady, N.Y.

[21] Appl. No.: 273,581

[22] Filed: Jul. 11, 1994

Related U.S. Application Data

[63] Continuation of Ser. No. 924,989, Aug. 5, 1992, abandoned.

[51] Int. Cl.$^6$ ............................................. H01F 1/00
[52] U.S. Cl. .................................. 335/216; 335/299; 324/318
[58] Field of Search ............... 335/216, 296, 299, 300; 324/318, 319; 128/653.5

[56] References Cited

U.S. PATENT DOCUMENTS

| | | | |
|---|---|---|---|
| 4,748,414 | 5/1988 | Knuettel et al. | 324/318 |
| 4,818,966 | 4/1989 | Miyamoto et al. | 335/296 |
| 4,875,485 | 10/1989 | Matsutani . | |
| 4,924,198 | 5/1990 | Laskaris . | |
| 5,008,624 | 4/1991 | Yoshida . | |
| 5,085,219 | 2/1992 | Ortendahl et al. | 128/653.5 |
| 5,124,651 | 6/1992 | Danby et al. | 324/318 |
| 5,134,374 | 7/1992 | Breneman et al. | 324/319 |
| 5,153,546 | 10/1992 | Laskaris | 335/216 |

FOREIGN PATENT DOCUMENTS

| | | |
|---|---|---|
| 314262 | 5/1989 | European Pat. Off. . |
| 424808 | 5/1991 | European Pat. Off. . |

OTHER PUBLICATIONS

J. A. Nelder and R. Mead, "A Simplex Method for Function Minimization," *Computer Journal*, vol. 7, 1965, pp. 308–313.

W. R. Brody, "New Design May Invigorate Resistive Magnet Technology," *Diagnostic Imaging*, Oct. 1985, pp. 134–139.

*Primary Examiner*—Lincoln Donovan
*Attorney, Agent, or Firm*—Patrick R. Scanlon; Paul R. Webb, II

[57] ABSTRACT

An open magnet having two magnet assemblies arranged in a spaced-apart, parallel relationship to define a working space therebetween is provided for magnetic resonance imaging. Each assembly has an annular superconductive coil and a ferromagnetic field enhancer encircled by the superconductive coil. The field enhancers are substantially cylindrical ferromagnetic pole pieces which are encircled by a respective one of the superconductive coils. The magnet assemblies are attached to a C-shaped support frame which is rotatively mounted to a pedestal member. The frame can thus be rotated between vertical and horizontal imaging positions. The field enhancers are shaped so as to maximize homogeneity in the imaging volume while keeping their weight and volume to a minimum. The specific shape of the field enhancers is determined with a nonlinear optimization design method.

14 Claims, 3 Drawing Sheets

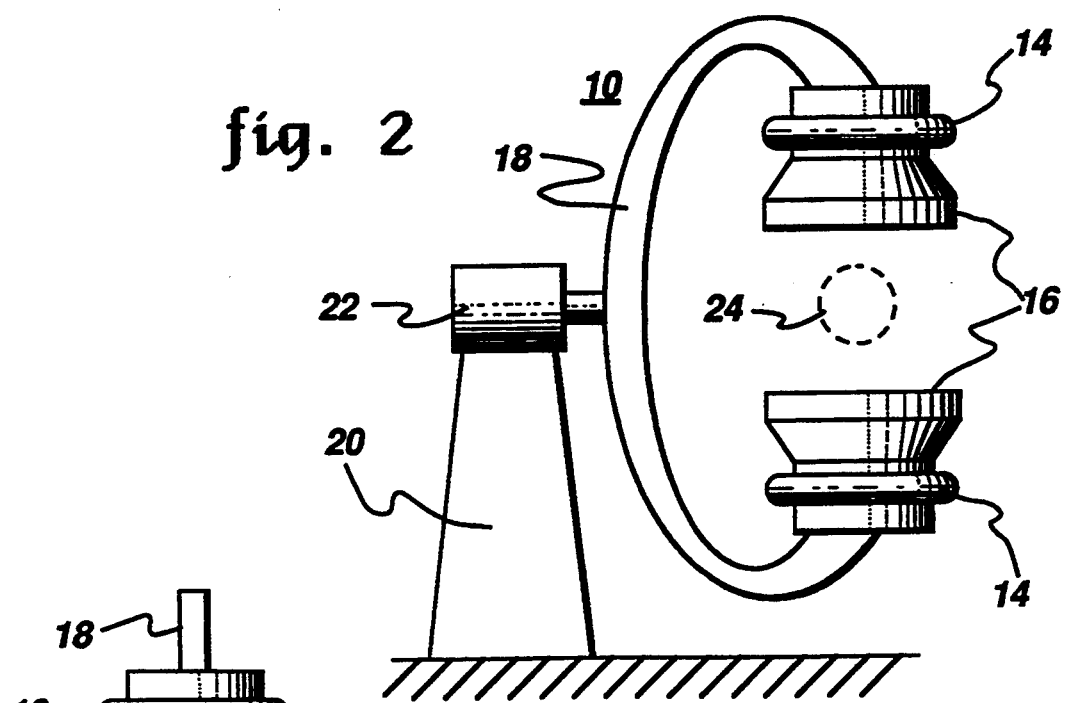
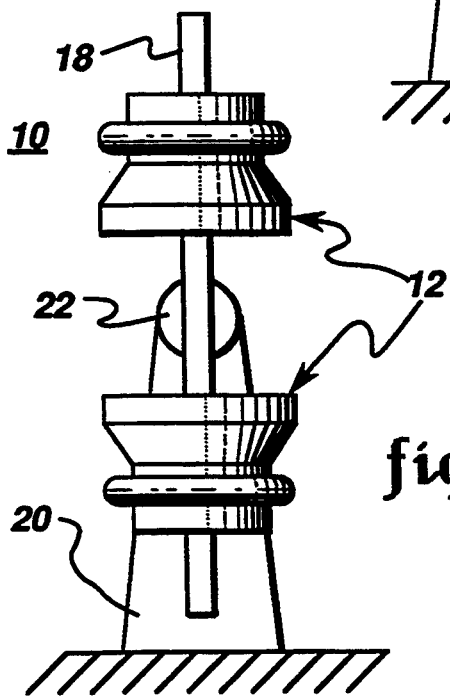
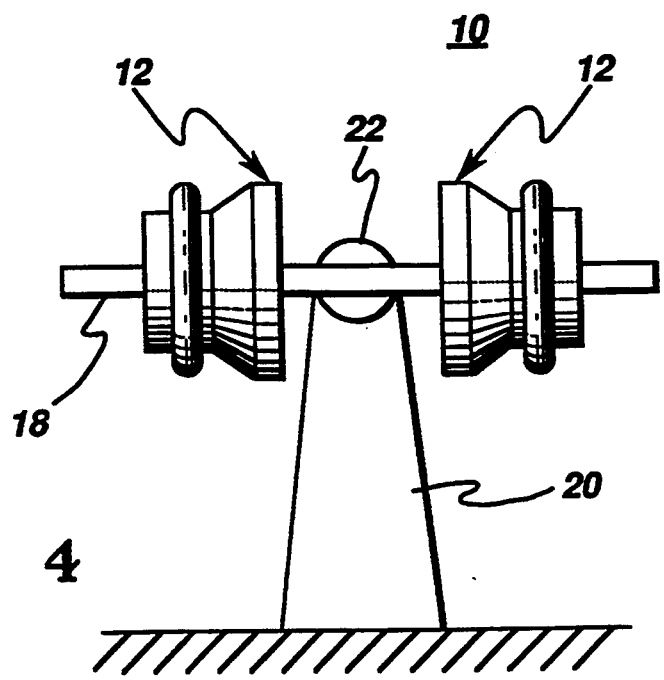

OPEN (NON-ENCLOSED) MAGNETS FOR MAGNETIC RESONANCE IMAGING

CROSS REFERENCE TO RELATED APPLICATIONS

This application is a Continuation of application Ser. No. 07/924,989, filed 5 Aug., 1992 now abandoned.

This application is related to copending application entitled "Method for Designing Open MRI Magnets," Ser. No. 07/924,990, filed Aug. 5, 1992 and assigned to the same assignee as the present invention.

BACKGROUND OF THE INVENTION

This invention relates generally to magnetic resonance imaging magnets and more particularly concerns a non-enclosed magnet arrangement which combines refrigerated superconducting coils with ferromagnetic pole pieces.

Magnetic resonance imaging (MRI) is now a widely accepted medical diagnostic procedure and its use is becoming increasingly popular. MRI systems require a uniform magnetic field and radio frequency radiation to create an MR image. Various types of magnets are currently used to produce the magnetic field. Whatever type of magnet is used, it is necessary that a portion of the magnetic field be highly homogeneous. This portion of the magnetic field, referred to herein as the imaging volume, is the portion of the field which covers the subject being imaged. Field homogeneity in the imaging volume is necessary to obtain a quality image. Therefore, it is advantageous for many imaging applications to have a magnet which can produce a relatively large imaging volume.

Typically, magnets used for whole body imaging are arranged so as to be contained within a cylindrical structure having a relatively narrow central bore. The narrow bore forms an enclosed chamber into which a patient must enter for imaging. These cylindrical arrangements provide many positive features, but there are some circumstances in which they present difficulties. For example, a significant percentage of patients are sensitive to the closed nature of conventional MRI systems. For them, the MRI process can be uncomfortable or even unbearable. Furthermore, some patients are simply too large to fit into the narrow chamber of a conventional MRI system. Difficulties can also arise in placing a patient in the enclosed chamber if the patient is required to remain connected to an IV system or other medical equipment. The closed conventional systems are also difficult for veterinary applications because many animals are frightened by the closed chamber.

Various open magnet arrangements have been proposed which present more accessible alternatives to the closed, conventional systems. One such magnet arrangement is described in U.S. Pat. No. 4,875,485, issued Oct. 24, 1989 to Kinya Matsutani which comprises two superconductive coils arranged in a spaced-apart, parallel relationship to define a working space therebetween. The relatively open space is well-suited to receiving patients and is not likely to induce claustrophobic reactions. This arrangement is said to create an spherical imaging volume having a diameter of 20 cm with a homogeneity of 50 to 100 ppm.

U.S. Pat. No. 4,924,198, issued May 8, 1990 to Evangelos T. Laskaris shows another open magnet arrangement in which two magnet assemblies are arranged in a spaced-apart, parallel relationship. In one embodiment, each magnet assembly comprises a superconductive coil and an inboard resistive coil situated substantially coplanar and concentrically therewith. This embodiment with a 0.5 Tesla central field presents a spherical imaging volume of 20 cm with a peak-to-peak homogeneity of 30 ppm. In a second embodiment, each magnet assembly comprises a pair of superconducting coils. This embodiment presents a spherical imaging volume of 25 cm with a homogeneity of 13 ppm at 0.5 Tesla.

U.S. Pat. No. 5,153,546, issued Oct. 6, 1992 to Evangelos T. Laskaris also shows an open magnet arrangement having two parallel, spaced apart superconductive coils. This device also includes a pivot mechanism which permits the pair of coils to be rotated between horizontal and vertical positions. With a field strength of about 0.3 to 0.5 Tesla, this arrangement provides a spherical imaging volume of 30 cm with a homogeneity of about 30 ppm.

The above open magnet arrangements produce imaging volumes ranging from 20-30 cm in diameter. While these arrangements are effective, it would be advantageous to have an open MRI device which could produce an even larger diameter imaging volume while still maintaining a sufficient level of homogeneity.

SUMMARY OF THE INVENTION

Accordingly, it is an object of the present invention to provide easy access for whole body MR imaging to all patients including those who are sensitive to closed spaces.

More specifically, it is an object of the present invention to provide an open magnet arrangement for MR imaging which maintains a highly homogeneous field in a large imaging volume.

It is another object of the present invention to facilitate MR imaging for veterinary applications.

In addition, it is an object of the present invention to provide a method for designing a magnet which fulfills the above objectives.

These and other objects are accomplished in the present invention by providing an open magnet having two magnet assemblies arranged in a spaced-apart, parallel relationship to define a working space therebetween. Each assembly comprises an annular superconductive coil and a ferromagnetic field enhancer encircled by the superconductive coil. The magnet assemblies are attached to a C-shaped support frame which is rotatively mounted to a pedestal member. The frame can thus be rotated between vertical and horizontal imaging positions. The field enhancers are ferromagnetic pole pieces which are specially shaped with a nonlinear optimization design method to improve the homogeneity in the imaging volume.

The design method comprises the steps of defining an initial shape of the pole piece, selecting design parameters which affect the magnetic field, defining a function of the selected parameters (called the objective function) which is the difference between the actual magnetic field and a perfectly homogeneous magnetic field, and minimizing the objective function to determine values of the parameters which define an optimal shape of the pole piece. The initial shape of the pole piece is preferably a substantially cylindrical shape and the primary parameters are perturbation points on the surface of an end face of the substantially cylindrical shape. Minimization is accomplished using a known minimization technique which automatically adjusts the parameters until a local minimum of the objective function is reached. In carrying out the minimization step, the objective function is evaluated using a finite element method.

Other objects and advantages of the present invention will become apparent upon reading the following detailed description and the appended claims and upon reference to the accompanying drawings.

DESCRIPTION OF THE DRAWINGS

The subject matter which is regarded as the invention is particularly pointed out and distinctly claimed in the concluding portion of the specification. The invention, however, may be best understood by reference to the following description taken in conjunction with the accompanying drawing figures in which:

FIG. 2 is a side view of the non-enclosed magnet arrangement of the present invention;

FIG. 3 is a front view of the non-enclosed magnet arrangement as positioned for horizontal imaging;

FIG. 4 is a front view of the non-enclosed magnet arrangement as positioned for vertical imaging;

DETAILED DESCRIPTION OF THE INVENTION

Figure 1:
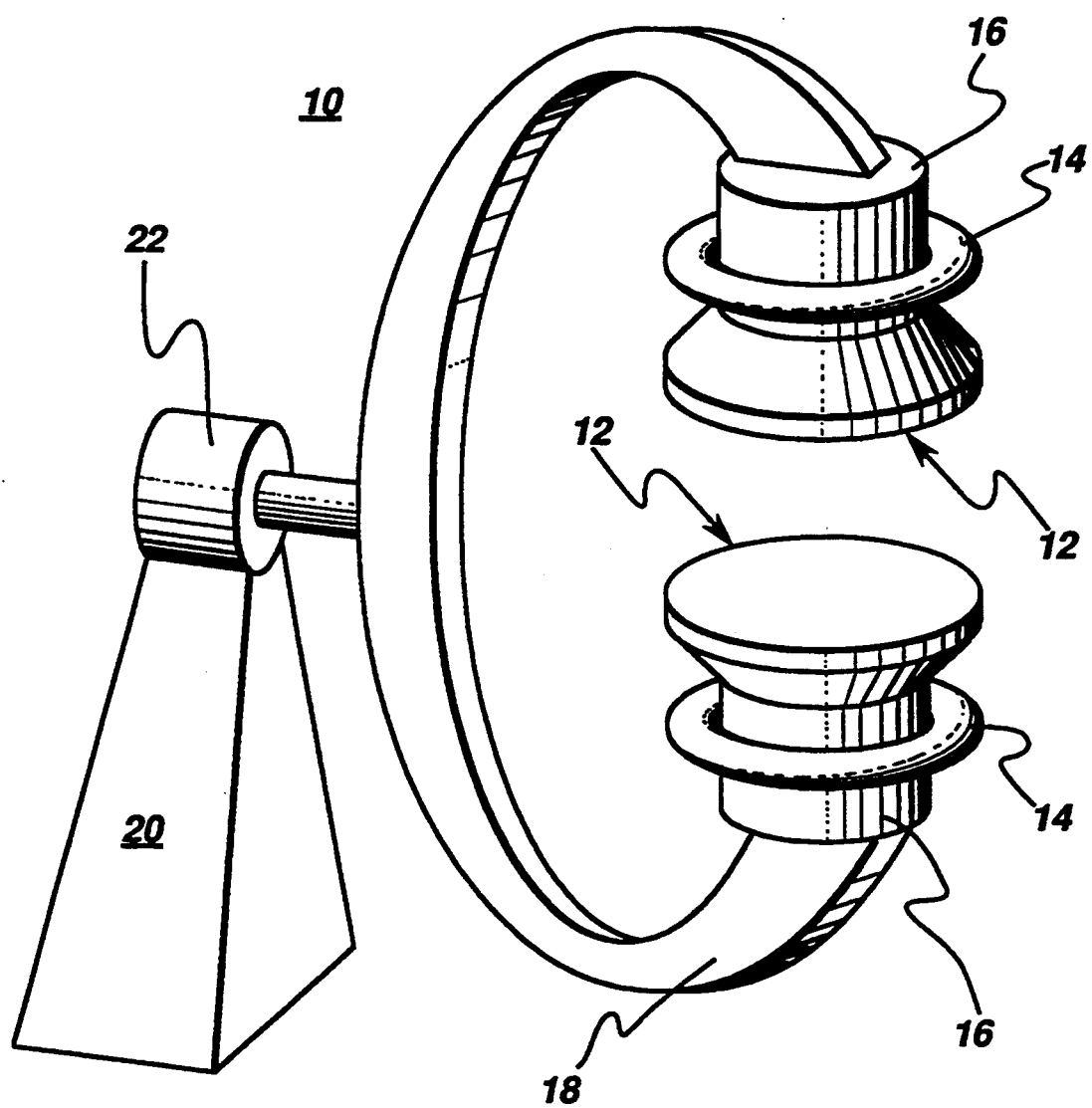
FIG. 1 is a perspective view of the non-enclosed magnet arrangement of the present invention.

Referring now to the drawings wherein like numerals indicate like elements throughout, FIGS. 1-4 show an MR open magnet device 10 of the present invention. The open magnet device 10 comprises two magnet assemblies 12 arranged in a spaced-apart relationship to define a working space therebetween. Each assembly 12 comprises an annular superconducting coil assembly 14 and a field enhancer 16. The field enhancers 16 are substantially cylindrical ferromagnetic pole pieces which are encircled by a respective one of the annular coil assemblies 14. Each superconducting coil assembly 14 is attached to its respective field enhancer 16 by brackets (not shown). The two magnet assemblies 12 are situated so that the end faces of the field enhancers 16 lie in parallel planes with their centers being on a line extending perpendicular to the planes.

The two magnet assemblies 12 are supported by a support frame 18 made of a non-magnetic material, such as stainless steel or aluminum. The frame 18 is C-shaped so as to support the magnet assemblies 12 in a spaced-apart, opposing relationship. This positioning of the magnet assemblies creates an open space therebetween of sufficient size to receive a patient for MR imaging. The magnet assemblies 12 create a magnetic field in the space therebetween. The support frame 18 is rotatively mounted to a pedestal 20 via a pivot mechanism 22. The pivot mechanism 22 allows the support frame 18 and the magnet assemblies 12 to be rotated between two imaging positions. In one imaging position, shown in FIGS. 1-3, the parallel end faces of the field enhancers 16 lie horizontally to permit imaging of a patient in a recumbent position. FIG. 4 shows the other imaging position where the support frame has been rotated 90° about the axis of the pivot mechanism 22 so that the parallel end faces of the field enhancers 16 lie vertically. In this position, a patient can be imaged while standing. A suitable pivot mechanism for this purpose is described in the above-mentioned U.S. Pat. No. 5,153,546, which is hereby incorporated by reference.

The superconducting coil assemblies 14 can be any type of annular coil of superconductive material. For example, a suitable superconducting coil assembly is described in the above-mentioned U.S. Pat. No. 4,924,198. U.S. Pat. No. 4,924,198, which is hereby incorporated by reference, describes an assembly comprising an epoxy-impregnated superconducting coil supported by an aluminum ring. The coil and ring are surrounded by a thermal shield and the entire assemblage is contained within a vacuum enclosure. Cooling is accomplished with a two-stage cryocooler. As the superconducting coil assemblies 14 do not, in and of themselves, constitute an inventive aspect of the present invention, they need not be described in further detail for a full understanding of the invention.

Acting alone, the coil assemblies 14 would produce a magnetic field having relatively poor homogeneity and low field strength. The portion of the field having adequate homogeneity for imaging, i.e., the imaging volume, would be small. By including the ferromagnetic field enhancers or pole pieces 16, the present invention increases field strength and greatly improves the homogeneity of the magnetic field, thus producing a large diameter spherical imaging volume 24 of adequate homogeneity. That is, by properly shaping the pole pieces, they alter the field so as to produce more uniformity in a larger spherical imaging volume 24.

Ideally, the pole pieces 16 are shaped so as to maximize homogeneity in the spherical imaging volume 24 while keeping their weight and volume to a minimum. The ideal pole piece shape of the present invention is determined using a nonlinear optimization design method which automatically adjusts selected magnet design parameters via a computer simulation to achieve the desired magnetic field strength and homogeneity. Generally, this design method involves determination of a function of the design parameters, referred to herein as the objective function, which measures the difference of an actual magnetic field from the ideal case of a perfectly homogeneous field. Once determined, the objective function is then minimized to find a design which produces a field that most closely reflects a perfectly homogeneous field.

As mentioned above, the first step of the design method is to determine an objective function which is the difference between the actual magnetic field and a perfectly homogeneous field. Being a function of the selected parameters, the objective function changes as the parameters are varied. In creating the objective function, the points of evaluation of the objective function must also be defined. The points of evaluation refer to specific points in the imaging volume, primarily on the surface, at which the strength and homogeneity of the magnetic field are to be determined for the purpose of evaluation. The next step is to define the initial pole piece model. This is essentially the beginning shape which is to be reshaped by the design method into a shape that provides a better magnetic field. The initial pole piece model is typically determined empirically; for the present invention a substantially cylindrical shape is selected.

Once the initial shape is defined, the design parameters which are to be altered must be selected, and their constraints must be defined. The design parameters are numerical variables related to the design of the magnet. The primary parameters are the geometric dimensions of the pole piece, but other physical quantities such as the current, windings and relative position of the superconducting coils can also be taken into consideration. The most critical parameter for reducing magnetic field inhomogeneity in the vicinity of iron pole pieces is the shape of each end face facing the imaging volume, referred to herein as the pole faces. The pole faces are represented mathematically by a number of points on the surface of each pole face which can be perturbed up or down in a vertical direction parallel to the longitudinal axis of the pole piece. These points are thus referred to as perturbation points.

The selected parameters can be varied only within limits that are physically reasonable. Thus, certain constraints must be placed on the parameters. For example, the perturbation points on the pole faces cannot be adjusted too close to the imaging volume because a given clearance from the imaging volume must be maintained. Another constraint on the perturbation points is that the vertical distance between two adjacent perturbation points cannot exceed a given value; otherwise, manufacture of the pole face surface would not be feasible. If the superconducting coils are being considered, then other constraints must be added. For example, the inner diameter of the superconducting coil cannot be smaller than the diameter of the pole piece and there may be limits on the amount of current which can pass through certain superconducting materials.

The final step is to minimize the objective function, thereby producing a pole piece shape which provides a magnetic field that most closely reflects a perfectly homogeneous field. Minimization is achieved using a nonlinear optimization algorithm. Since the objective function is highly nonlinear, an algorithm for converging on a local minimum of the objective function which is robust and amenable to incorporation of certain constraints is required. The simplex method described in the article "A Simplex Method for Function Minimization," *Computer Journal*, Vol. 7, 1965, pages 308-313, by J. A. Nelder and R. Mead, which is hereby incorporated by reference, meets these requirements and is the preferred method. The Nelder-Mead method achieves convergence on a local minimum of the objective function without needing to estimate partial derivatives of the objective function with respect to the design parameters, which is an important consideration since the objective function is available only through numerical analysis.

The basic idea of the Nelder-Mead method is to start with an arbitrary simplex in the feasible space and converge on a local minimum of the objective function through a sequence of transformations of the simplex. The transformations involve the comparison of function values at each of the vertices of the simplex, followed by the replacement of the vertex with the highest value by another point. The new point is determined by a series of mathematical operations. A more detailed description is provided in the above-mentioned article.

As mentioned above, the Nelder-Mead method calls for the comparison of the values of the objective function at each vertex of the simplex. To do this the values of the objective function must be known. The present invention uses the well known finite element method to model the magnet on a computer and to calculate the objective function at each vertex. Each time the parameters are adjusted during the process, a new finite element mesh is created and the finite element solver is run to compute the new values of the objective function.

Figure 5:
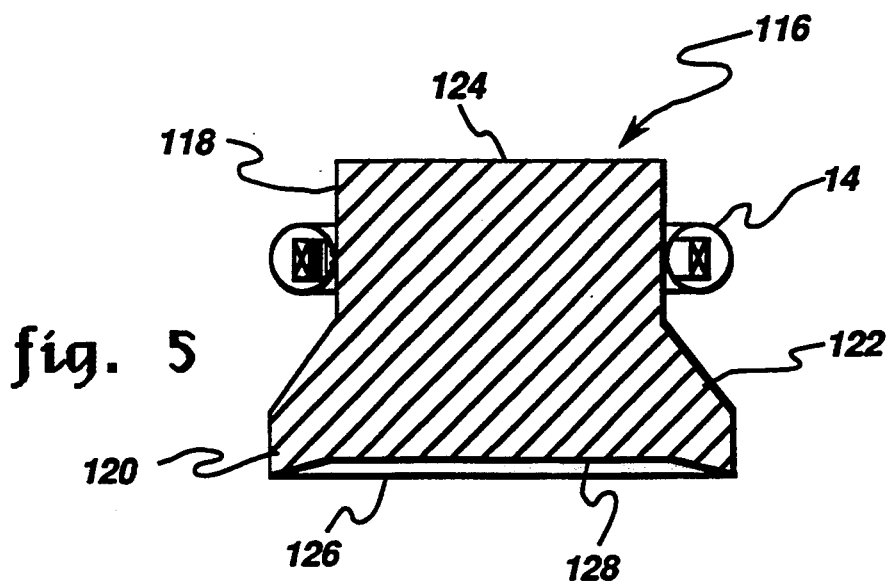
FIG. 5 is a cross-sectional view of a first embodiment of a shaped pole piece of the present invention.
Figure 6:
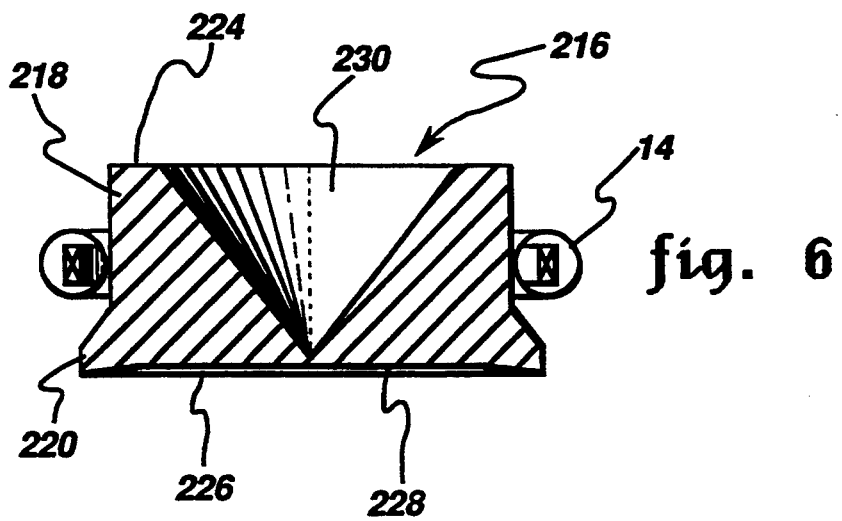
FIG. 6 is a cross-sectional view of a second embodiment of a shaped pole piece of the present invention.
Figure 7:
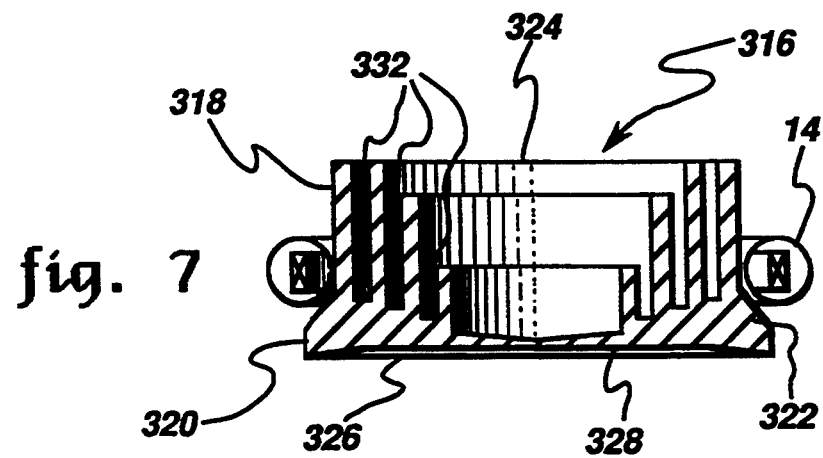
FIG. 7 is a cross-sectional view of a third embodiment of a shaped pole piece of the present invention.

FIGS. 5-7 show three different embodiments of shaped ferromagnetic pole pieces determined by the above method. A substantially cylindrical shape was empirically chosen as the starting shape for the pole pieces. Given this shape, the shapes of the end faces which face the imaging volume, referred to herein as the pole faces, become the critical design parameters for reducing the magnetic field inhomogeneity in the vicinity of ferromagnetic pole pieces. Thus, in the embodiments of FIGS. 5-7, the above described optimization method was used to determine the most appropriate shape of the pole face given the other design parameters such as height and diameter of the substantially cylindrical shape.

In particular, FIG. 5 shows a cross-sectional view of a first embodiment of a shaped field enhancer or pole piece 116. The pole piece 116 comprises a first cylindrical portion 118, a second cylindrical portion 120 having a greater diameter than the first cylindrical portion, and a frustoconical portion 122 joining the first and second cylindrical portions. The superconducting coil assembly 14 is attached to the first cylindrical portion 118 which is longer than the second cylindrical portion 120. Thus, the pole piece 116 is a substantially cylindrical member having two end faces 124,126. The first or outer end face 124, which is adjacent to the first cylindrical portion 118, faces away from the spherical imaging volume 20 while the second end face 126, i.e., the pole face, faces toward the spherical imaging volume 20. The pole face 126 has a shallow, field enhancing recess 128 formed therein. The specific shape of the recess 128, which is determined by the design method discussed above, is such that the whole combination produces a magnetic field having a large, homogeneous imaging volume.

While the first embodiment of the pole piece in FIG. 5 provides excellent homogeneity, it does present a significant weight. Other embodiments of shaped pole pieces which have weight reduction designs are shown in FIGS. 6 and 7. Specifically, FIG. 6 shows a cross-sectional view of a second embodiment of a shaped pole piece 216. The second embodiment is similar to the first embodiment of FIG. 5 in that it comprises a first cylindrical portion 218, a second cylindrical portion 220 having a greater diameter than the first cylindrical portion, and a frustoconical portion 222 joining the first and second cylindrical portions. Pole piece 216 differs from the first embodiment in that a conical recess 230 is formed in the outer end face 224. The conical recess 230 serves to substantially reduce the total weight of the pole piece 216. A field enhancing recess 228 is formed in the pole face 226 to produce an optimum level of homogeneity within a relatively large imaging volume. The shape of recess 228 is determined in accordance with the design optimization method which automatically adjusts for the presence of the conical recess 230, thus the field enhancing recess 228 is slightly different than the corresponding field enhancing recess 128 of the first embodiment 116.

When used in the open magnet arrangement of the present invention, the pole pieces 216 of FIG. 6 are preferably made of iron and have a pole face diameter of 1.4 meters. The weight of a pair of these pole pieces is approximately 21,000 pounds. The superconducting coil assemblies 14 each have 300,000 ampere-turns and the central field strength is 0.35 Tesla. For such an arrangement, the calculated homogeneity in a 30 cm diameter spherical imaging volume is 12 ppm and 69 ppm in a 40 cm diameter spherical imaging volume.

FIG. 7 shows a cross-sectional view of a third embodiment of a shaped pole piece 316. As with the first and second embodiments, the shaped pole piece 316 comprises a first cylindrical portion 318, a second cylindrical portion 320 having a greater diameter than the first cylindrical portion, and a frustoconical portion 322 joining the first and second cylindrical portions. Weight reduction is achieved in the embodiment of FIG. 7 by providing a plurality of concentric annular grooves 332 in the outer end face 324. Again, a field enhancing recess 328 is formed in the pole face 326 to produce an optimum level of homogeneity within a relatively large imaging volume. The shape of recess 328 is determined in accordance with the design optimization method which automatically adjusts for the presence of the annular grooves 332, thus the recess 328 is slightly different than the corresponding field enhancing recesses of the first and second embodiments.

A pair of poles pieces 316 of FIG. 7 being made of iron and having pole face diameters of 1.4 meters would weigh about 12,100 pounds. For an open magnet having a pair of the pole pieces 316 and operating with a field strength of 0.31 Tesla, calculated homogeneity in a 25 cm diameter spherical imaging volume is 25 ppm and 40 ppm in a 30 cm diameter spherical imaging volume.

The foregoing has described an open magnet for MR imaging which provides ready access to most patients and produces a large, homogeneous imaging volume. A useful method for designing an optimal shape of the pole pieces in the MR magnet is also disclosed. While specific embodiments of the present invention have been described, it will be apparent to those skilled in the art that various modifications thereto can be made without departing from the spirit and scope of the invention as defined in the appended claims.

What is claimed is:

1. A magnet assembly comprising:
 a superconductive coil; and
 a ferromagnetic field enhancer disposed adjacent to said superconductive coil, said ferromagnetic field enhancer comprising a first cylindrical portion, a second cylindrical portion having a greater diameter than said first cylindrical portion, and a frustoconical portion joining said first and second cylindrical portions, said ferromagnetic field enhancer having a recessed end face formed on said second cylindrical portion.

2. The magnet assembly of claim 1 wherein said first cylindrical portion has an end face with a conical recess formed therein.

3. The magnet assembly of claim 1 wherein said first cylindrical portion has an end face with a plurality of annular grooves formed therein.

4. The magnet assembly of claim 3 wherein said grooves are of varying depths.

5. An open magnet device comprising:
 first and second superconductive coils;
 a first ferromagnetic field enhancer encircled by said first superconductive coil; and
 a second ferromagnetic field enhancer encircled by said second superconductive coil, each one of said first and second ferromagnetic field enhancers comprising a first cylindrical portion, a second cylindrical portion having a greater diameter than said first cylindrical portion and a recessed end face formed thereon, and a frustoconical portion joining said first and second cylindrical portions, said first and second field enhancers being spaced apart from and parallel to one another so as to define a working volume therebetween.

6. The open magnet device of claim 5 further comprising a support frame which supports said field enhancers in a spaced-apart, parallel relationship.

7. The open magnet device of claim 6 further comprising a pedestal member to which said support frame is rotatively mounted.

8. The open magnet device of claim 5 wherein said first cylindrical portion has an end face with a conical recess formed therein.

9. The open magnet device of claim 5 wherein said first cylindrical portion has an end face with a plurality of annular grooves formed therein.

10. The open magnet device of claim 9 wherein said grooves are of varying depths.

11. The magnet assembly of claim 1 wherein said superconductive coil encircles said first cylindrical portion.

12. The open magnet device of claim 5 wherein said first superconductive coil encircles said first cylindrical portion of said first field enhancer, and said second superconductive coil encircles said first cylindrical portion of said second field enhancer.

13. The open magnet device of claim 5 wherein said recessed end face of said first ferromagnetic field enhancer and said recessed end face of said second ferromagnetic field enhancer both face said working volume.

14. An open magnet device comprising:
 a pedestal;
 a C-shaped frame rotatively mounted to said pedestal;
 a first ferromagnetic field enhancer attached to one end of said C-shaped frame;
 a second ferromagnetic field enhancer attached to another end of said C-shaped frame, each one of said first and second ferromagnetic field enhancers comprising a first cylindrical portion, a second cylindrical portion having a greater diameter than said first cylindrical portion and a recessed end face formed thereon, and a frustoconical portion joining said first and second cylindrical portions, said first and second field enhancers being spaced apart from and parallel to one another so as to define a working volume therebetween;
 a first superconductive coil encircling said first ferromagnetic field enhancer; and
 a second superconductive coil encircling said second ferromagnetic field enhancer.

* * * * *